US006931712B2

(12) United States Patent
Long et al.

(10) Patent No.: US 6,931,712 B2
(45) Date of Patent: Aug. 23, 2005

(54) METHOD OF FORMING A DIELECTRIC SUBSTRATE HAVING A MULTITURN INDUCTOR

(75) Inventors: David Clifford Long, Wappingers Falls, NY (US); Harsaran S. Bhatia, Hopewell Junction, NY (US); Harvey Charles Hamel, Poughkeepsie, NY (US); Edward R. Pillai, Wappingers Falls, NY (US); Christopher David Setzer, Poughkeepsie, NY (US); Benjamin Paul Tongue, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/757,199

(22) Filed: Jan. 14, 2004

(65) Prior Publication Data

US 2005/0150106 A1   Jul. 14, 2005

(51) Int. Cl.[7] .................................................. H01E 7/06
(52) U.S. Cl. ...................... 29/602.1; 29/825; 29/832; 29/846; 336/83; 336/192; 336/200
(58) Field of Search ..................... 29/602.1, 825, 29/832, 846; 336/200, 83, 192, 232

(56) References Cited

U.S. PATENT DOCUMENTS

| | | | |
|---|---|---|---|
| 3,614,554 A | * | 10/1971 | Shield et al. ................ 257/531 |
| 3,731,005 A | * | 5/1973 | Shearman .................... 360/123 |
| 3,812,442 A | | 5/1974 | Muckelroy |
| 4,543,553 A | * | 9/1985 | Mandai et al. ................. 336/83 |
| 5,032,815 A | * | 7/1991 | Kobayashi et al. ............ 336/83 |
| 5,302,932 A | * | 4/1994 | Person et al. ................ 336/200 |
| 5,389,428 A | | 2/1995 | Fleming et al. |
| 5,392,019 A | * | 2/1995 | Ohkubo ....................... 336/200 |
| 5,610,569 A | | 3/1997 | Hwang et al. |
| 5,884,990 A | | 3/1999 | Burghartz et al. |
| 5,945,902 A | | 8/1999 | Lipkes et al. |
| 6,008,102 A | | 12/1999 | Alford et al. |
| 6,008,151 A | | 12/1999 | Sasaki et al. |
| 6,104,272 A | | 8/2000 | Yamamoto et al. |
| 6,147,573 A | | 11/2000 | Kumagai et al. |
| 6,160,469 A | | 12/2000 | Liberatore et al. |
| 6,189,200 B1 | | 2/2001 | Takeuchi et al. |
| 6,292,086 B1 | | 9/2001 | Chu |
| 6,459,352 B1 | | 10/2002 | Liu et al. |

FOREIGN PATENT DOCUMENTS

JP          06-119386       *   5/1994    ........... H01F 17/00

OTHER PUBLICATIONS

IBM Technical Disclosure Bulletin, vol. 29, No. 2, Jul. 1986 entitled, "Method Of Fabricating Deflection Coils For Electron Lithography Systems".

* cited by examiner

*Primary Examiner*—Carl J. Arbes
(74) *Attorney, Agent, or Firm*—Ira D. Blecker

(57) ABSTRACT

A dielectric substrate having an embedded inductor wherein each turn of the inductor traverses several layers such that the top and bottom of each turn of the inductor are parallel to each other but are in different layers and the sides of each turn of the inductor traverse at least one layer to connect the top and bottom of the inductor.

10 Claims, 12 Drawing Sheets

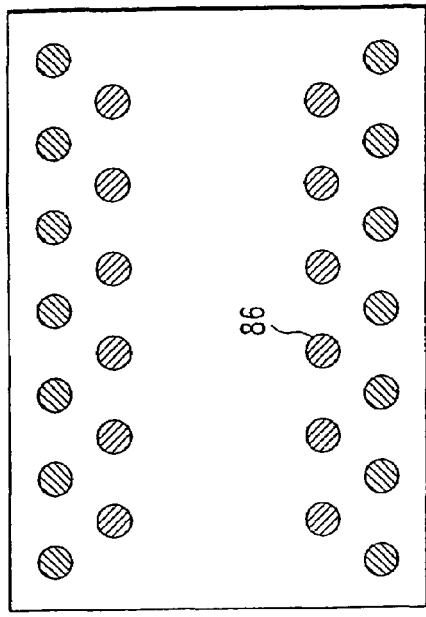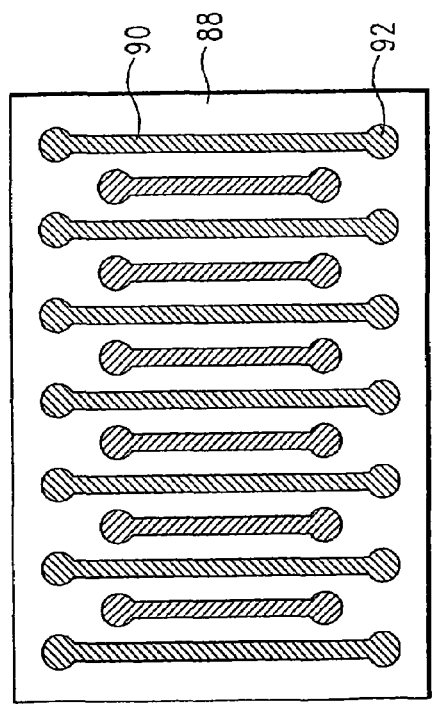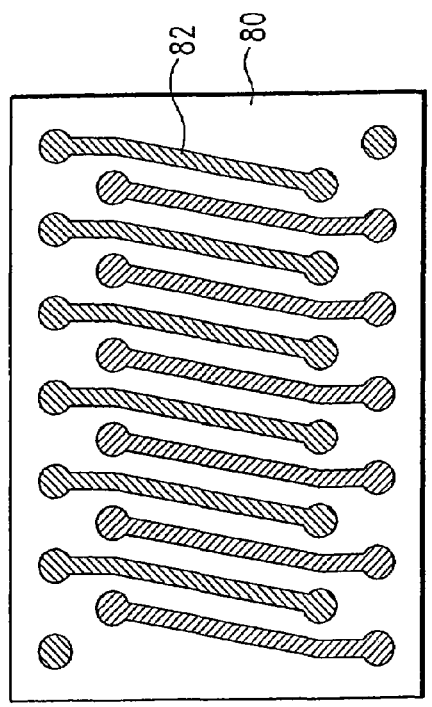
FIG. 11B
FIG. 11A
FIG. 11C

METHOD OF FORMING A DIELECTRIC SUBSTRATE HAVING A MULTITURN INDUCTOR

BACKGROUND OF THE INVENTION

The present invention relates to the field of embedded inductors and, more particularly, relates to tunable, three dimensional embedded inductors buried in a dielectric substrate, most preferably a multilayer ceramic (MLC) substrate.

Conventional MLC structures are formed from ceramic greensheets which are prepared by mixing a composition of ceramic particulate, a thermoplastic polymeric binder, plasticizers and solvents. The ceramic particulate may contain particles of, for example, alumina, aluminum nitride, glass-ceramic, glass plus ceramic, and silicates. This composition is spread or cast into ceramic sheets or slips from which the solvents are subsequently volatilized to provide coherent and self-supporting flexible greensheets. After blanking, via formation, screening of electrically conductive vias and lines, stacking and laminating, the greensheet laminates are eventually fired at temperatures sufficient to drive off the polymeric binder resin and sinter the ceramic particulates together into a densified ceramic substrate. The metals used for the electrically conductive vias and lines are chosen to be compatible with the ceramic material and may include copper as well as refractory metals such as molybdenum and tungsten.

MLC structures are not widely used for radio frequency and analog devices such as rf amplifiers, transformers and impedance matching networks because there have not been easy, cost effective ways to integrate inductors, transformers and the like into the MLC structure. Q is a quality factor for inductors and is defined as the ratio of its reactance to its effective series resistance at a given frequency. It would be desirable to have an embedded inductor with a relatively high Q value and high inductance.

Others have proposed various embedded inductors.

Muckelroy U.S. Pat. No. 3,812,442, the disclosure of which is incorporated by reference herein, discloses a three dimensional inductor in which a coil is imprinted on each layer. Such a design leads to undesirable capacitance between the layers. Capacitance is undesirable because it decreases self resonant frequency. Further, due to the thinness of the metalization, there is a high resistance path resulting in lower Q.

Fleming et al. U.S. Pat. No. 5,389,428, the disclosure of which is incorporated by reference herein, disclose a process for making surface mount inductors having ferrite cores.

Hwang et al. U.S. Pat. No. 5,610,569, the disclosure of which is incorporated by reference herein, disclose an embedded inductor formed of conductive strips and columns of vias. Due to overlap of the top and bottom portions of the inductor, undesirable capacitance results along with lower Q.

Lipkes et al. U.S. Pat. No. 5,945,902, Sasaki et al. U.S. Pat. No. 6,008,151, Kumagai et al. U.S. Pat. No. 6,147,573 and Takeuchi et al. U.S. Pat. No. 6,189,200, the disclosures of which are incorporated by reference herein, disclose embedded inductors having one turn of the coil per each layer resulting in high turn to turn capacitance.

Alford et al. U.S. Pat. No. 6,008,102, the disclosure of which is incorporated by reference herein, disclose a three dimensional inductor coil fabricated on top of a semiconductor substrate. It is noted therein that the insulating core of previous prior art devices is not favored because it is too lossy for many high frequency applications. Further, the inductor structure has very thin conductor lines which lead to high resistance and low Q.

Yamamoto et al. U.S. Pat. No. 6,104,272, the disclosure of which is incorporated by reference herein, disclose a coil which is subsequently embedded in a ceramic chip element.

Libertore et al. U.S. Pat. No. 6,160,469, the disclosure of which is incorporated by reference herein, disclose a two dimensional inductor. Two dimensional inductors are not preferred because three dimensional inductors have less conductor length per a given volume. Further, two dimensional inductors are more affected by outside fields because of the large, unprotected fringe field whereas in three dimensional inductors, a large portion of the fringe field is located within the loops which shield it.

IBM Technical Disclosure Bulletin, 29, No. 2, p. 783 (July 1986) discloses an embedded MLC coil which is used as a magnetic deflection coil for an electron beam lithography machine. Such a structure cannot be integrated in an electronic package.

Notwithstanding the above-noted work of others with respect to embedded inductors, there remains a need for an improved embedded inductor, particularly one buried or embedded in MLC.

Accordingly, it is a purpose of the present invention to have an embedded inductor having high Q and high inductance.

It is another purpose of the present invention to have an embedded inductor with low capacitance.

It is yet another purpose of the present invention to have an embedded inductor that is tunable.

These and other purposes of the present invention will become more apparent after referring to the following description considered in conjunction with the accompanying drawings.

BRIEF SUMMARY OF THE INVENTION

The purposes of the invention have been achieved by providing, according to a first aspect of the present invention, a dielectric substrate having a multiturn inductor comprising:
  a) a multilayer dielectric body comprising a plurality of layers;
  b) a multiturn inductor buried within the dielectric body, each turn of the inductor comprising a bottom portion, a top portion and two side portions, the bottom portion and top portion being parallel and in different layers of the dielectric body, the side portions being parallel to each other and extending between the top and bottom portions and comprising vias in the dielectric body.

According to a second aspect of the present invention, there is provided a method of forming a dielectric substrate having a multiturn inductor, the method comprising the steps of:
  a) obtaining a plurality of layers;
  b) forming conductive lines on a first group of layers;
  c) forming conductive vias in a second group of layers;
  d) forming conductive lines on a third group of layers;
  e) stacking at least one layer from the second group of layers on at least one layer from the third group of layers; and
  f) stacking at least one layer from the first group of layers on the at least one layer from the second group of layers wherein the stacking of the first, second and third groups of layers form an inductor buried within a dielectric substrate.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

FIGS. 11A, 11B and 11C illustrate the different dielectric layers used to make the embedded inductor of FIG. 10.

DETAILED DESCRIPTION OF THE INVENTION

Figure 9:
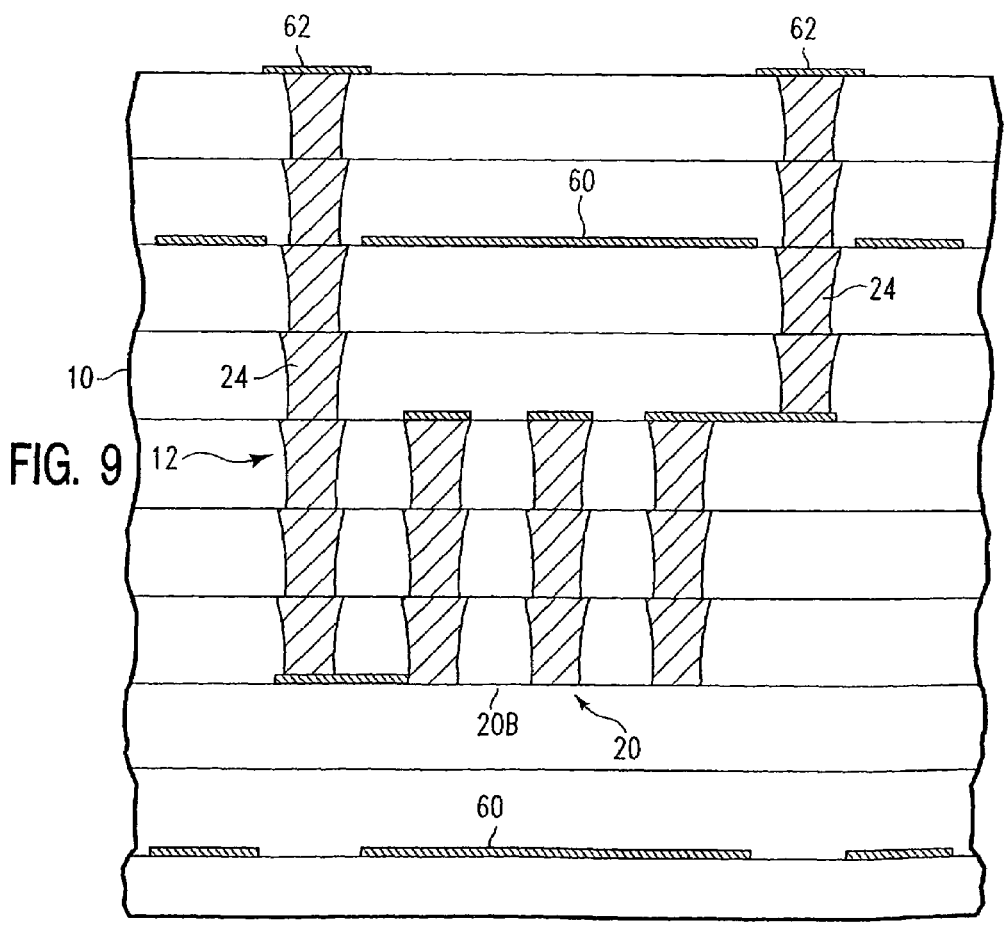
FIG. 9 is a cross sectional view of the embedded inductor of FIG. 1 in its environment.

Referring to the Figures in more detail, and particularly referring to FIG. 9, there is shown a cross sectional view of a dielectric substrate 10, most preferably an MLC substrate 10, having the embedded inductor 12 according to the present invention. The embedded inductor 12 may also have termination vias 24 for connecting to pads 62 on the surface of the dielectric substrate 10. There may further be power and/or ground planes 60 above and below the embedded inductor 12. The dielectric substrate 10 may further include signal wiring lines, signal redistribution planes and additional termination pads on the surfaces of the dielectric substrate 10. The latter features are not shown for clarity.

Figure 1:
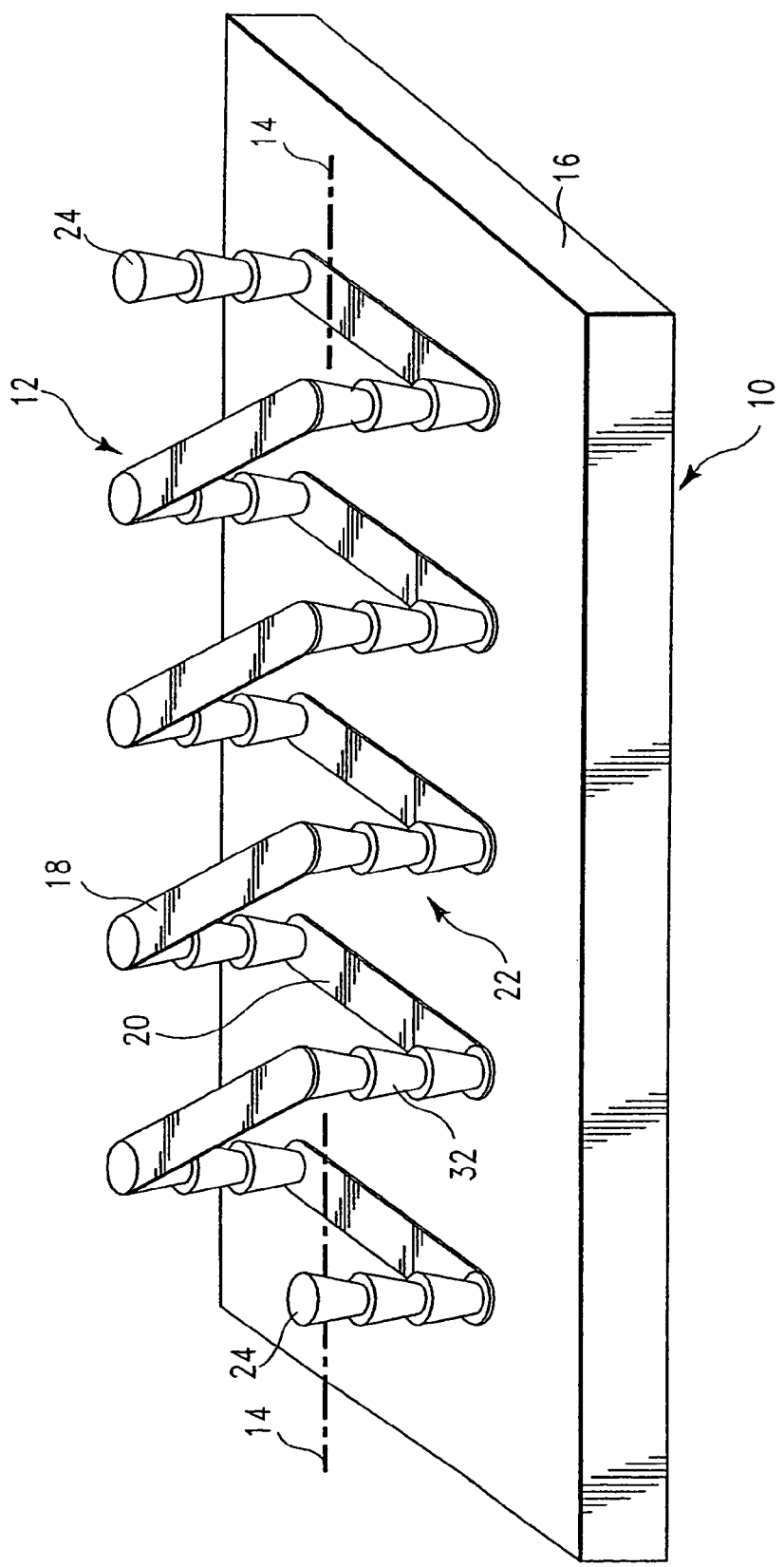
FIG. 1 is a perspective view of a first embodiment of an embedded inductor according to the present invention. The dielectric material that would normally obscure the embedded inductor has been removed for clarity.
Figure 2:
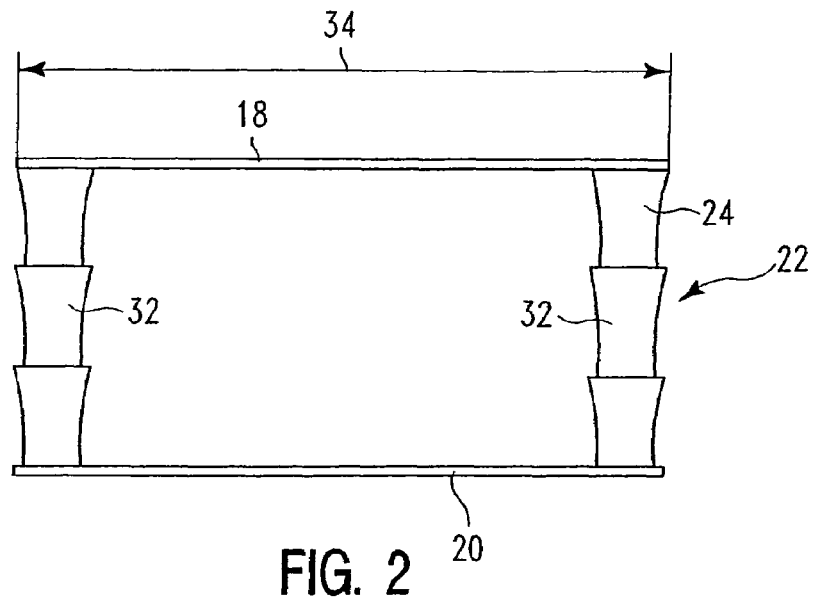
FIG. 2 is an end view of the embedded inductor of FIG. 1.

Referring now to FIGS. 1 and 2, there is shown the embedded inductor 12 in the dielectric substrate 10 with the ceramic material that would normally surround the embedded inductor 12 being removed. The embedded inductor 12 is essentially a multiturn coil that has an axis 14 that is parallel to the plane of each of the layers 16 that make up the dielectric substrate 10. Each turn of the coil comprises a top portion 18, a bottom portion 20 and two sides 22. As can be seen from FIGS. 1 and 2, the top portion 18 and bottom portion 20 are parallel and are in different layers. Thus, bottom portion 20 is in a first layer while top portion 18 is in another layer three layers away. The side portions 22, which connect a top portion 18 to a bottom portion 20, are generally perpendicular to the layers 16 of the Dielectric substrate 10. As the embedded inductor 12 may be made by MLC or similar technology, top portion 18 and bottom portion 20 will be formed by screened lines while side portions 22 comprise at least one via 32 but will usually comprise more than one via 32 as shown in FIGS. 1 and 2. The forming of the dielectric substrate 10 and embedded inductor 12 will be discussed in more detail hereafter. Lastly, the embedded inductor 12 has termination vias 24 which connect to other internal wiring (not shown) in the dielectric substrate 10.

Advantages of the embedded inductor 12 according to the present invention include high Q, high stability with respect to temperature, humidity, time, high inductance capabilities and low space constraints. Capacitance of the embedded inductor 12 is also minimized. A further advantage of the present invention is that the embedded inductor 12 may be tuned to optimize performance.

Figure 8:
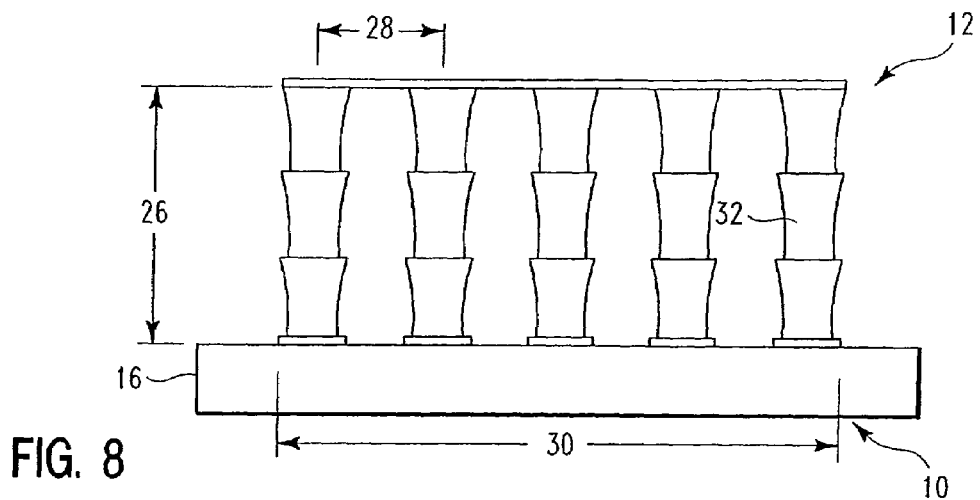
FIG. 8 is a front view of the embedded inductor of FIG. 1 illustrating the tunability of the embedded inductor.

Referring now to FIG. 8, a front view of the embedded inductor 12 is shown. Designing an embedded inductor 12 that produces a given amount of inductance can be done in a number of ways. Inductance can be increased by decreasing the inductor loop periodicity 28 or by increasing the number of loops 30 in the embedded inductor 12. As the size of the loop increases, the height 26 and width 34 (as shown in FIG. 2) of the loop increases and inductance will also increase. As the ratio of the loop height 26 to the loop width 34 approaches 1, the optimal amount of inductance is obtained for a given loop size. The width of the top portion 18 and bottom portion 20 and the diameter of the vias 32 also affect inductance. For example, as the via diameter increases, Q also increases due to a lowering of the resistivity of the loop. Similarly, as the width of the top portion 18 and bottom portion 20 increase, Q also increases.

The materials used for the ceramic material also have an effect on the self-resonant frequency of the inductor. For example, the ceramic material can be alumina or glass-ceramic. The higher the dielectric constant, the lower the self-resonant frequency. While the discussion thus far has centered on the use of ceramic materials for the dielectric substrate 10, it should be understood that organic materials, such as G10, FR4, fiberglass reinforced plastics and the like can also be used for the dielectric substrate 10. However, organic materials tend to absorb moisture which lowers the Q and can slightly affect the inductance.

Still referring to FIGS. 1 and 2, the top portion 18 and bottom portion 20 connecting the side portions 22 of the embedded inductor 12 have lower crossectional area than the side portions 22 and create higher resistance. Therefore, structural changes which minimize the resistance of the top portion 18 and bottom portion 20 create higher Q values and allow the optimization of the embedded inductor 12.

Figure 3:
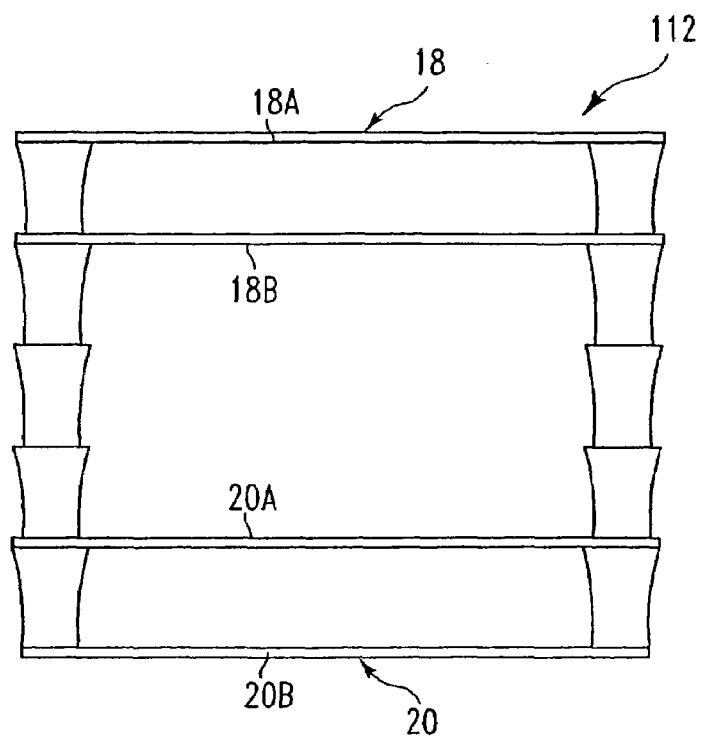
FIG. 3 is an end view of a second embodiment of the embedded inductor according to the present invention.

One example of such a structural change is that shown in FIG. 3 wherein the top portion 18 of embedded inductor 112 actually comprises top subportions 18A and 18B and bottom subportions 20A and 20B. By doubling the metal that is present in the inductor loop, the resistance of the embedded inductor 112 is reduced, thereby increasing its inductance.

Figure 4:
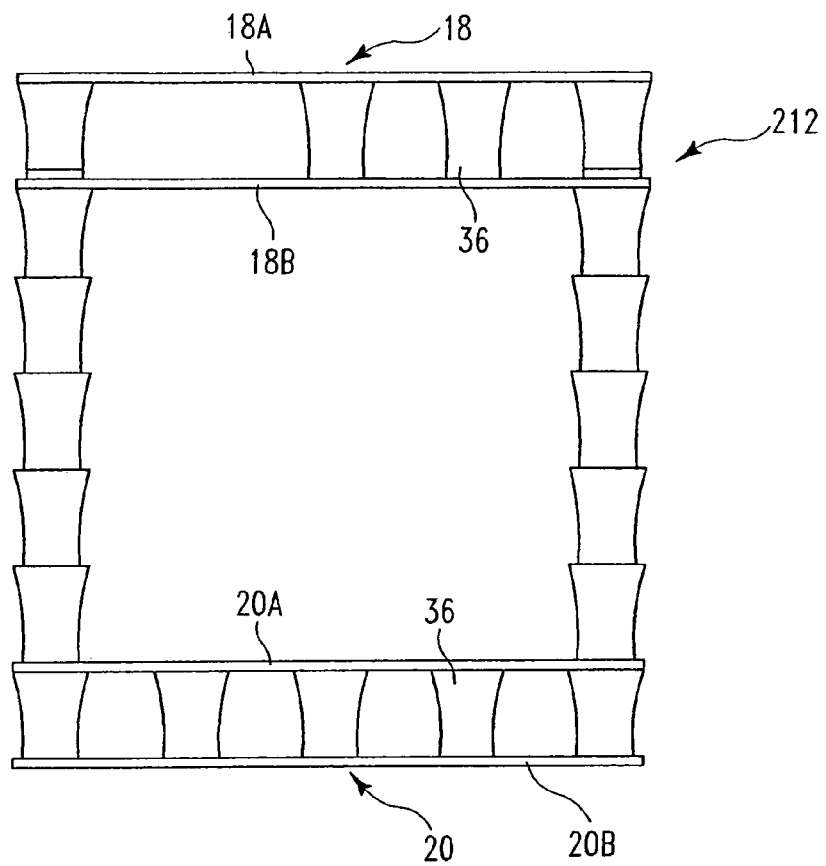
FIG. 4 is an end view of a third embodiment of the embedded inductor according to the present invention.

Referring now to FIG. 4, the embodiment shown in FIG. 3 has been modified by adding vias 36 between top subportions 18A and 18B as well as between bottom subportions 20A and 20B. The addition of vias 36 to the inductor loop should further reduce the resistance and increase the Q of embedded inductor 212.

Figure 5:
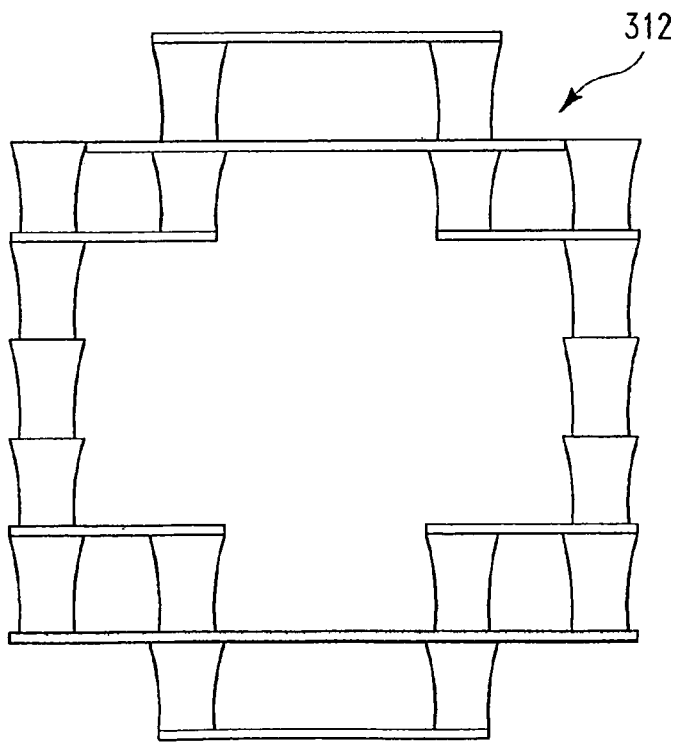
FIG. 5 is an end view of a fourth embodiment of the embedded inductor according to the present invention.

Another embodiment of the present invention is shown in FIG. 5 wherein the inductor loop has been made closer to a circular shape to further increase the Q of embedded inductor 312.

Figure 6:
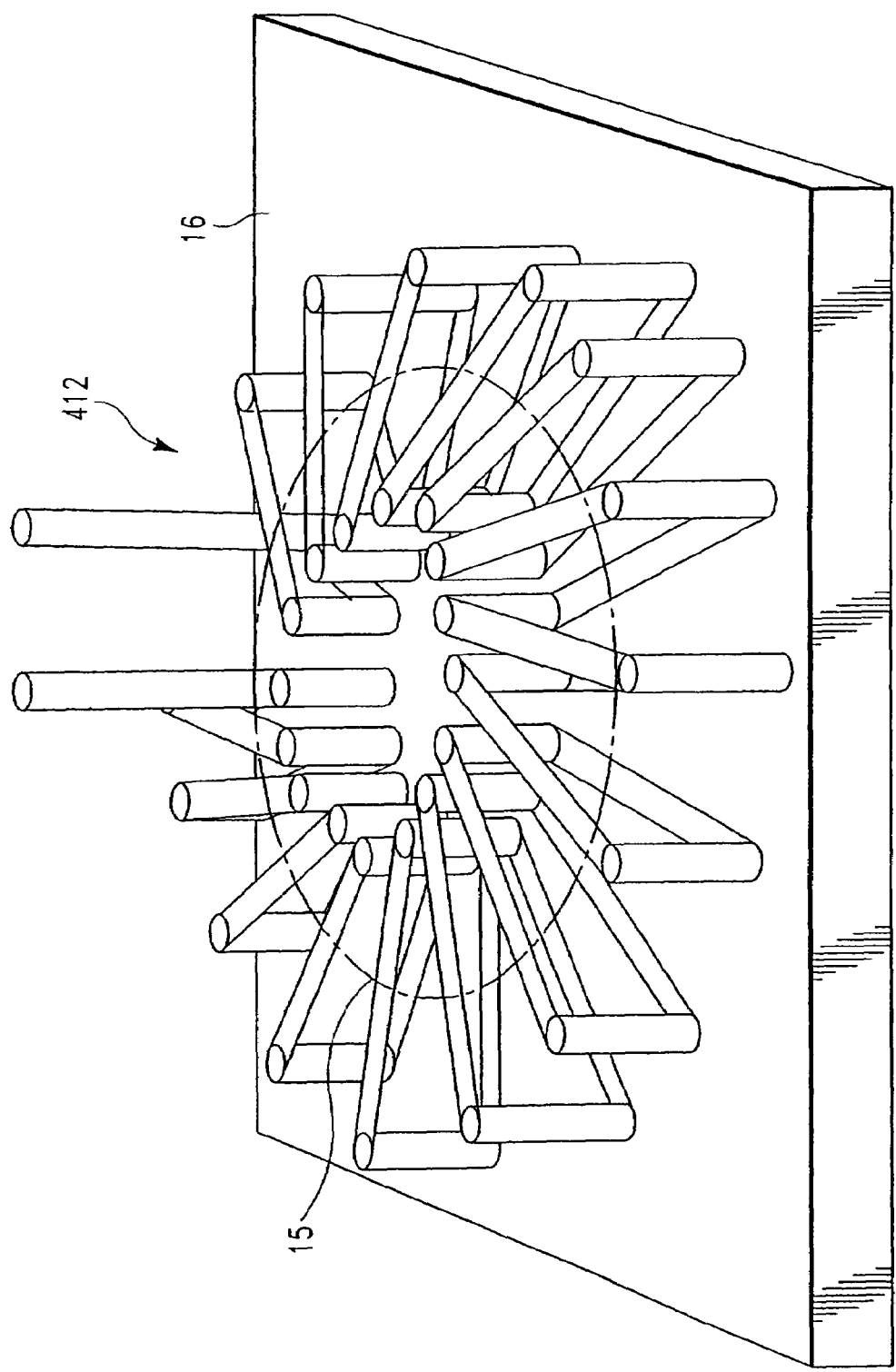
FIG. 6 is a perspective view of a fifth embodiment of the embedded inductor according to the present invention.

The embodiments discussed thus far are variations on the embedded inductor 12 shown in FIG. 1 wherein the embedded inductor 12, 112, 212, 312 has an axis 14 that is essentially a straight line. The embodiment of the present invention that is shown in FIG. 6 illustrates an embedded inductor 412 that has a circular axis 15 so that the embedded inductor 412 ends up having a toroidal shape. The axis of embedded inductor 412 remains parallel to the plane of ceramic layer 16. The advantages of the toroidal-shaped inductor shown in FIG. 6 are smaller external magnetic fields and reduced unwanted coupling to adjacent components.

Figure 7A:
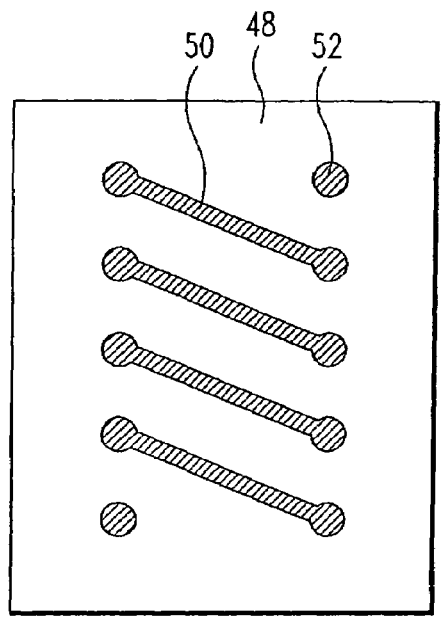
FIGS. 7A, 7B and 7C illustrate the different dielectric layers used to make the embedded inductors according to the present invention.
Figure 7B:
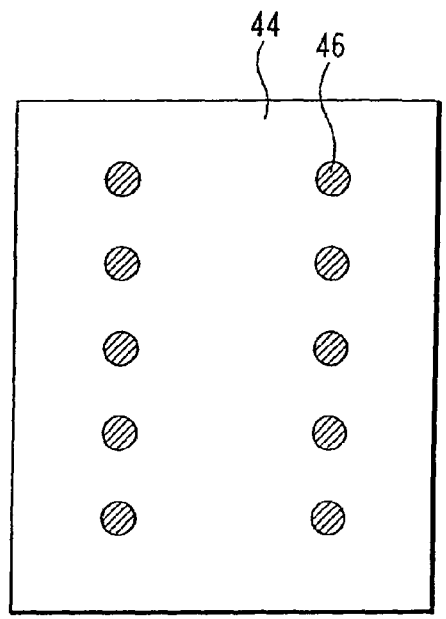
Figure 7C:
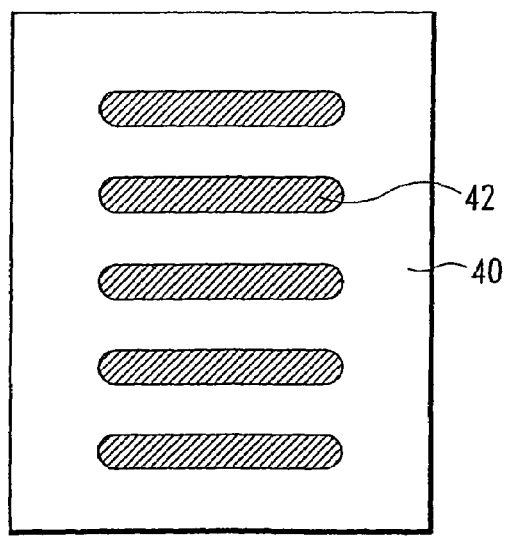

Referring now to FIGS. 7A, 7B and 7C, the method of making the embedded inductor 12 of FIG. 1 will be discussed. The base layers (16 as shown in FIG. 1), if any, of the dielectric substrate 10 are formed by conventional techniques as alluded to earlier. These base layers may contain various signal, ground or power wiring layers. On top of these base layers, a layer 40 having wiring lines 42 (as shown in FIG. 7C) is stacked followed by the stacking on layer 40 of one or more layers 44 having vias 46 (as shown in FIG. 7B) and layer 48 having wiring lines 50 and vias 52 (as shown in FIG. 7A). Vias 52 electrically connect the embedded inductor 12 to additional wiring in the dielectric substrate 10. On top of layer 48, there will usually be at least one additional wiring layer to connect the embedded inductor 12 to the top side of the dielectric substrate 10.

The process to make any of the other embedded inductors shown in FIGS. 3 to 6 would be the same as above except there would be additional wiring line layers 40 and 48 as well as one or more additional via layers 44.

Moreover, it should be understood that the wiring lines and via patterns shown in FIGS. 7A, 7B and 7C can be easily varied to facilitate any of the embedded inductor designs shown in FIGS. 1 through 6. For example, the via pattern of layer 44 shown in FIG. 7B would be varied to form the vias 36 of embedded inductor 212 as shown in FIG. 4. Additionally, the number of layers 44 would be adjusted to fit the desired size of the embedded inductor. Similarly, the wiring pattern 42 in layer 40 of FIG. 7C, the wiring pattern 50 and vias 52 in layer 48 of FIG. 7A, and the via pattern 46 in layer 44 of FIG. 7B would all have to be modified, according to the teachings of the present invention, to form the embedded inductor 412 shown in FIG. 6. The modification of the various layers as just discussed are well within the routine capabilities of one skilled in the art.

Figure 10:
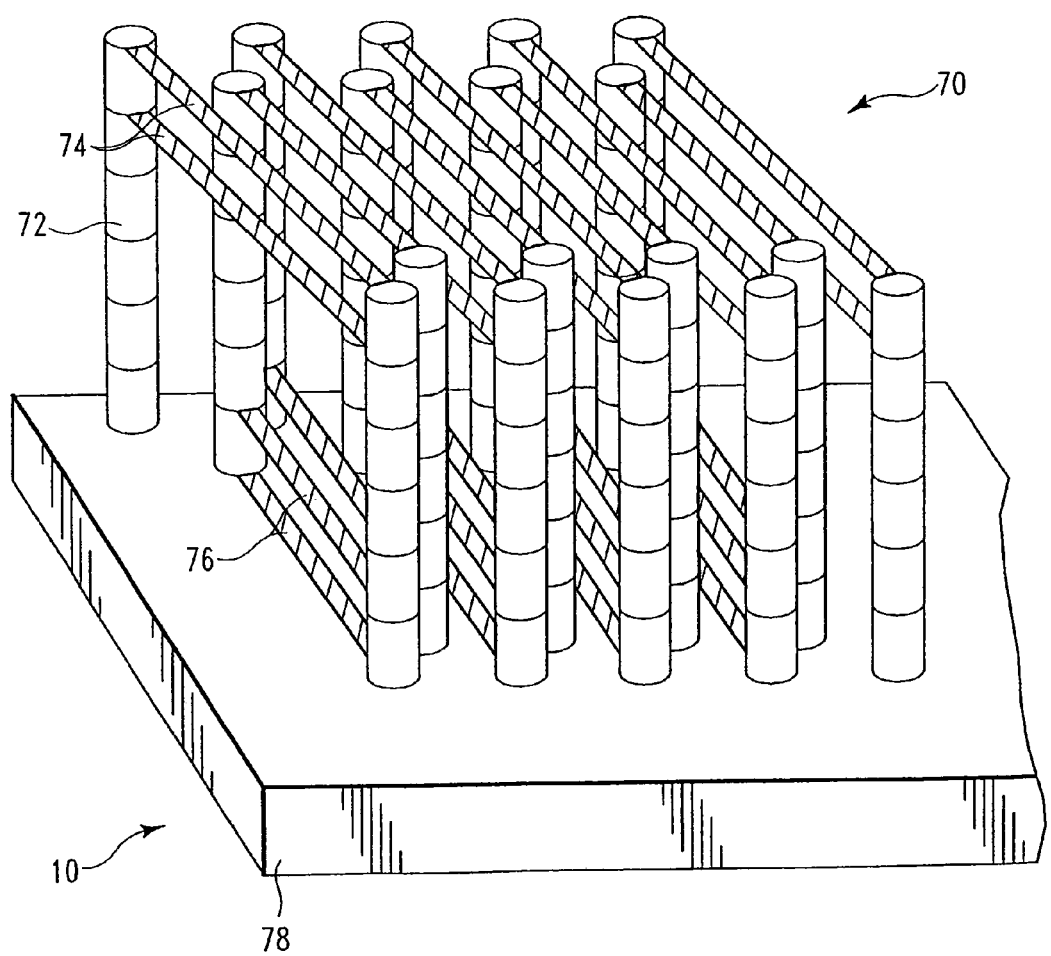
FIG. 10 is a perspective view of another embodiment of an embedded inductor according to the present invention. The dielectric material that would normally obscure the embedded inductor has been removed for clarity.

Another embodiment of the present invention is shown in FIG. 10 in which a perspective view of an embedded inductor 70 in a dielectric substrate 10 is illustrated. Again, the dielectric material that would normally surround the embedded inductor 70 is removed. Further, the dielectric substrate 10 may further include signal wiring lines, signal redistribution planes and termination pads on the surfaces of the dielectric substrate 10. The latter features are not shown for clarity.

It is noted that the embedded inductor 70 has staggered via columns 70 which enable a more tightly would structure. The embedded inductor 70 would advantageously produce high inductance values but without parasitic capacitance, thereby resulting in a high self resonant frequency. Q is maintained by double strapping of the top wiring lines 74 and bottom wiring lines 76.

Referring now to FIGS. 11A, 11B and 11C, the method of making the embedded inductor 70 of FIG. 10 will be discussed. The base layers (78, as shown in FIG. 10), if any, of the dielectric substrate 10 are formed by conventional techniques as alluded to earlier. These base layers may contain various signal, ground or power wiring layers. On top of these base layers, at least one layer 80, and preferably at least two layers 80, having wiring lines 82 (as shown in FIG. 11C) is stacked on the base layer(s) followed by the stacking of one or more layers 84 having vias 86 (as shown in FIG. 11B) and at least one layer 88, and preferably at least two layers 88, having wiring lines 90 and vias 92 (as shown in FIG. 11A). Vias 92 electrically connect the embedded inductor 70 to additional wiring in the dielectric substrate 10. On top of layer 88, there will usually be at least one additional wiring layer to connect the embedded inductor 70 to the top side of the dielectric substrate 10.

Figure 12A:
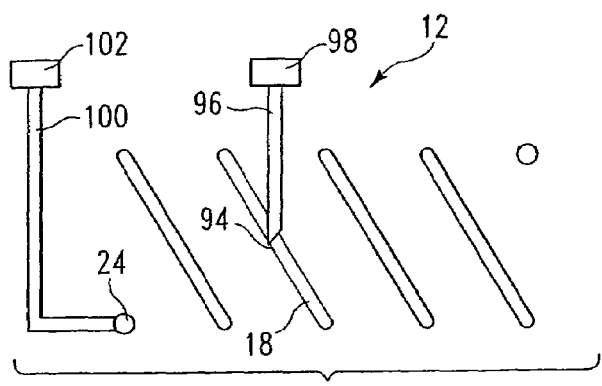
FIGS. 12A, 12B and 12C are top views of the dielectric substrate of FIG. 1 illustrating different operations for tuning the embedded inductor.
Figure 12B:
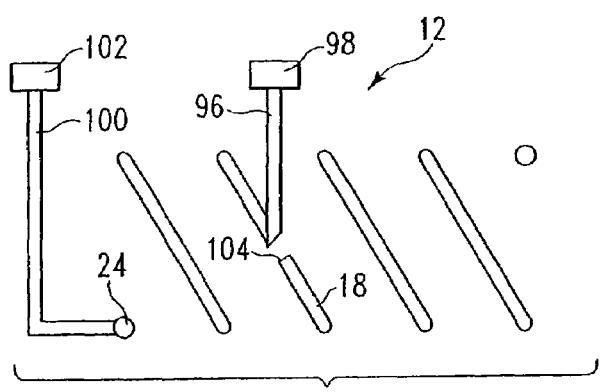
Figure 12C:
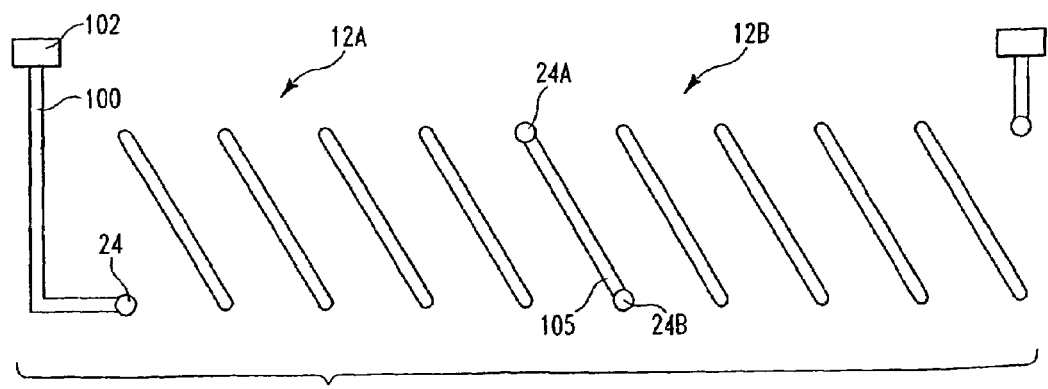

The embedded inductors according to the present invention are tunable, meaning that some operation can be performed on the embedded inductors that fine tunes the amount of inductance obtained. Tuning may occur, for example, by design changes (such as making the inductor closer to ideal shape or adding extra wiring lines to reduce resistance), deletion process (such as laser deletion, sand blasting, fuse links) which delete part of the inductor, or additive processes (such as adding silver paint or copper strips) to attach more loops to the inductor. Some of these operations are illustrated in FIGS. 12A, 12B and 12C. For tuning the embedded inductor, it is necessary to have the top of the embedded inductor exposed on the top surface of the dielectric substrate or be able to access the top of the embedded inductor such as by laser drilling through the dielectric substrate. Referring first to FIG. 12A, the top of the embedded inductor 12 is exposed such that access to wiring lines 18 is possible. Then, one of the wiring lines 18 is tapped at 94. Surface wiring line 96 is then formed, such as by silver painting or depositing a copper strip, to connect tap 94 to pad 98. Wiring line 100 connects termination via 24 to pad 102. Wiring line 100 and pad 102 were designed into the dielectric substrate when it was formed so no "post-forming" operation is necessary. By tapping the embedded inductor 12 at 94, the inductor coil has effectively been shortened. If desired, wiring line 18 may be severed, such as by laser deletion, at 104 as shown in FIG. 12B. Referring now to FIG. 12C, adjacent embedded inductor coils 12A and 12B have been connected to increase the inductance of the embedded inductor by adding wiring line 105, such as by silver paint or depositing a copper strip, between termination vias 24A and 24B.

Figure 13:
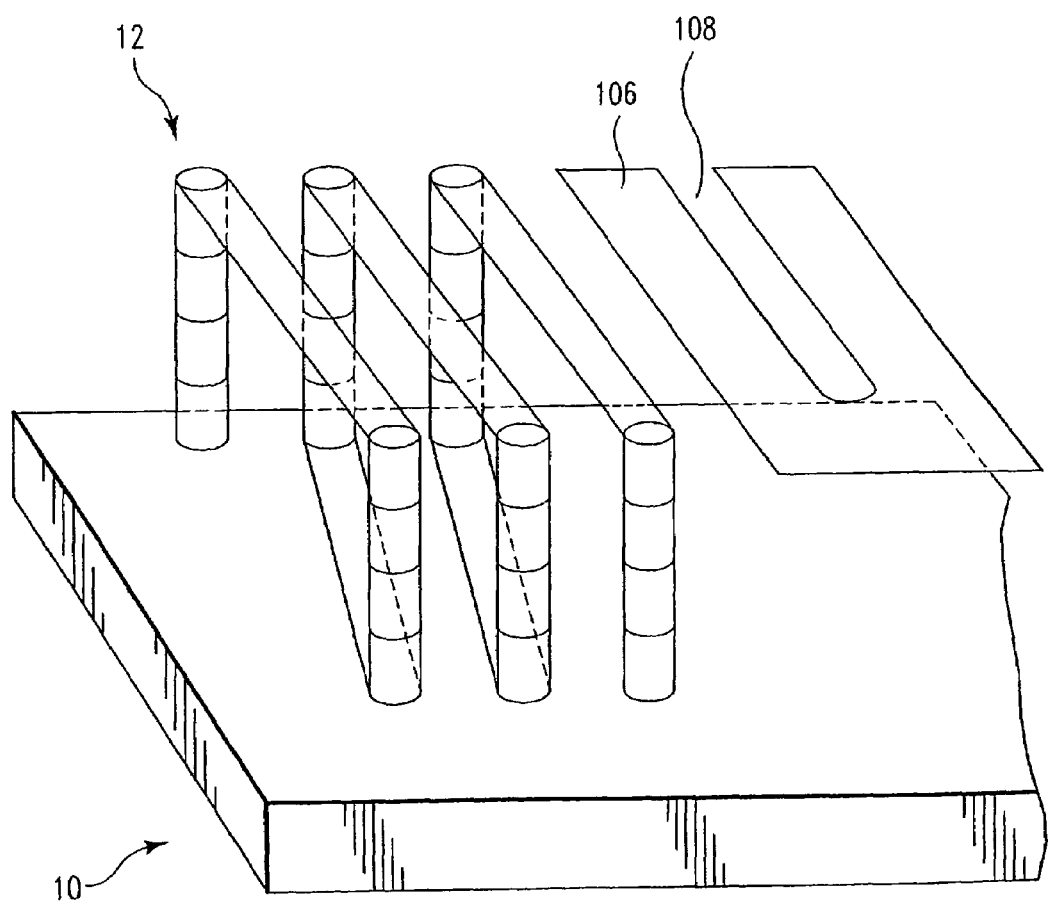
FIG. 13 is a perspective view of the embedded inductor of FIG. 1 with the addition of an electrically isolated plate for tuning the embedded inductor.
Figure 14:
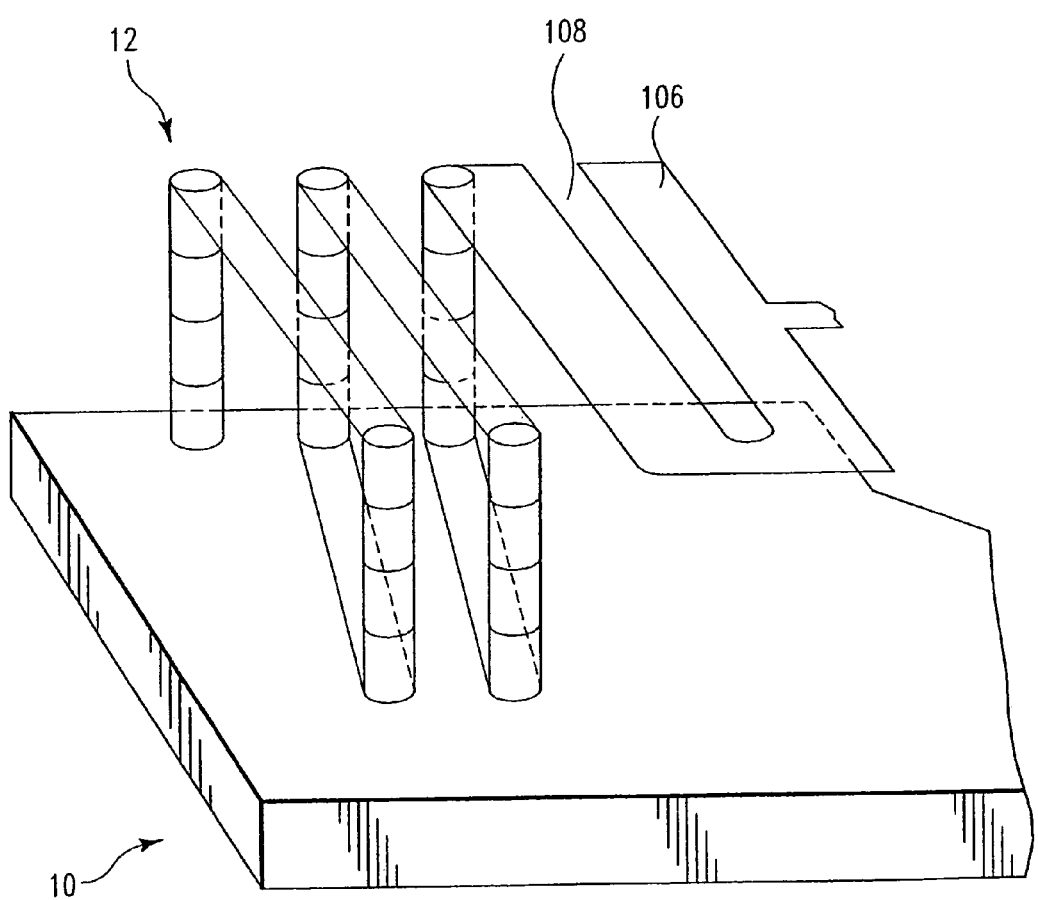
FIG. 14 is a perspective view of the embedded inductor of FIG. 1 with the addition of an electrically connected plate for tuning the embedded inductor.

An additional method of tuning the embedded inductor is illustrated in FIG. 13. By placing an electrically isolated plate 106 at either end or both ends of the embedded inductor 12, the inductance is reduced because the plate 106 is coupled magnetically to the embedded inductor 12 and intercepts the coil flux. By removing portion 108 of plate 106, such as by laser deletion, the inductance can be increased by some amount to tune a more accurate inductance value. A similar result can be obtained by electrically coupling plate 106 to the embedded inductor 12, and removing portion 108 of plate 106 if desired, as shown in FIG. 14.

Figure 15:
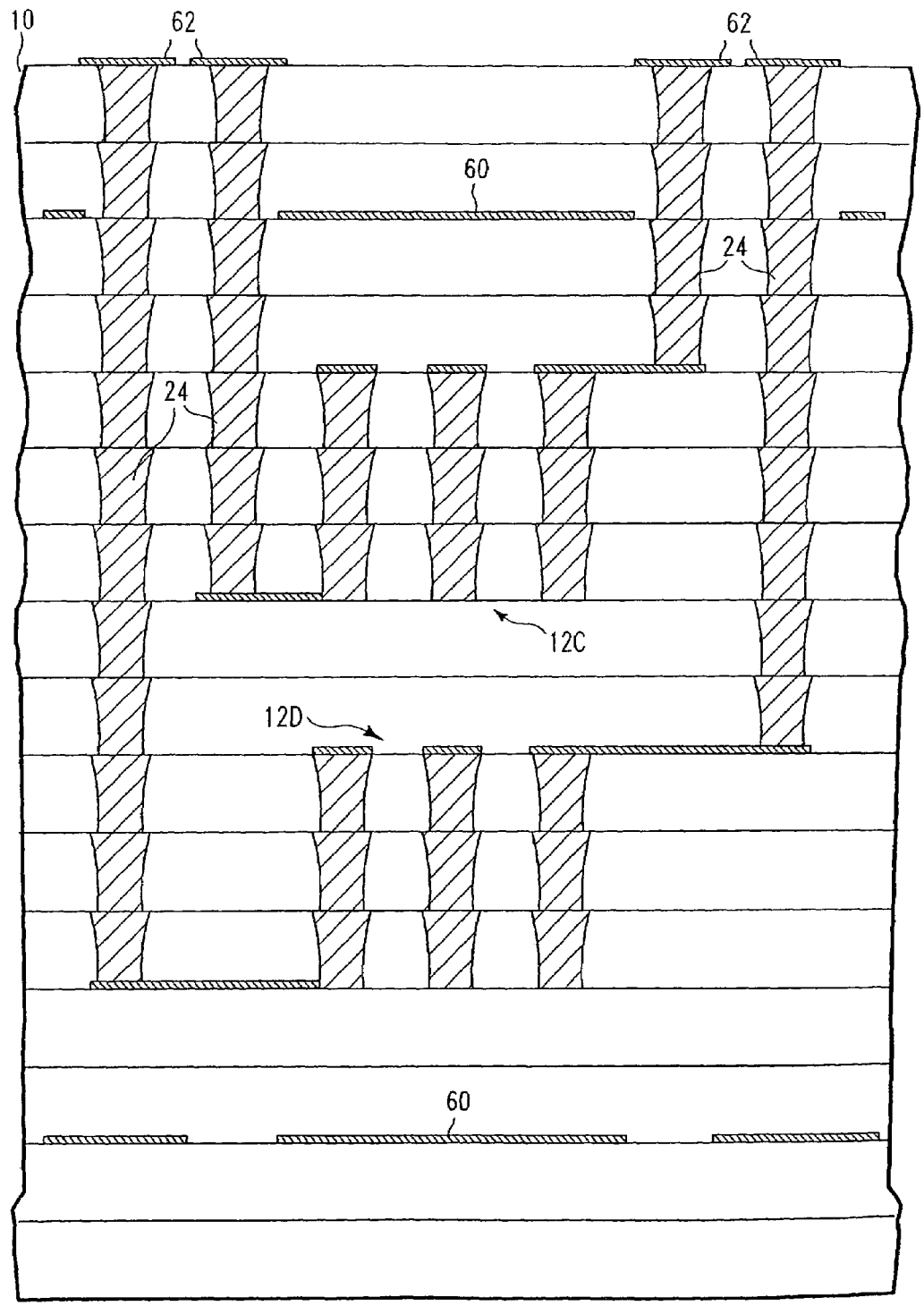
FIG. 15 is a cross sectional view similar to FIG. 9 but also showing a second embedded inductor which together with the first embedded inductor forms a transformer.

Referring now to FIG. 15, another embodiment of the present invention is illustrated. Dielectric substrate 10 has proximate, parallel embedded inductors 12C and 12D which together form a transformer. The embedded inductors 12C and 12D may also have termination vias 24 for connecting to pads 62 on the surface of the dielectric substrate 10. There may further be power and/or ground planes 60 above and below the embedded inductors 12C and 12D. The dielectric substrate 10 may further include signal wiring lines, signal redistribution planes and additional termination pads on the surfaces of the dielectric substrate 10 which are not shown for clarity. While the inductors shown are adjacent to one another, they could be nested (for example, toroidal within a toroidal) or coaxial (for example, end to end on the same axis or partially interleaved on the same axis).

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of forming a dielectric substrate having a multiturn inductor, the method comprising the steps of:
   a) obtaining a plurality of layers;
   b) forming conductive lines on a first group of layers;
   c) forming conductive vias in a second group of layers;
   d) forming conductive lines on a third group of layers;
   e) stacking at least one layer from the second group of layers on at least two layers from the third group of layers; and
   f) stacking at least two layers from the first group of layers on the at least one layer from the second group of layers wherein the stacking of the first, second and third groups of layers cause the vias in the second group of layers to contact the conductive lines in the first and third groups of layers to form an inductor buried within a dielectric substrate with each turn of the inductor comprising one conductive line from each layer of the first and third groups of layers and the conductive vias from the second group of layers and wherein, with respect to each turn of the inductor, the one conductive lines from each layer of the first group of layers are parallel and in juxtaposition to form a top of the each turn of the inductor and the one conductive lines from each layer of the third group of layers are parallel and in juxtaposition to form a bottom of the each turn of the inductor.

2. The method of claim 1 wherein the respective layers are greensheets and the inductor and dielectric substrate are unsintered and further comprising the step of: g) sintering the unsintered dielectric substrate having an unsintered inductor buried therein to form a dielectric substrate having a multiturn inductor buried therein.

3. The method of claim 1 wherein there are a plurality of layers from the second group of layers.

4. The method of claim 1 wherein the vias in the second group of layers contact the conductive lines in the first and third groups of layers only at the ends of the conductive lines.

5. The method of claim 1 wherein the vias in the second group of layers contact the conductive lines in the first and third groups of layers along the length of the conductive lines.

6. The method of claim 1 wherein the conductive lines in the first and third groups of layers are planar in shape so as to comprise a flat portion having a width and a thickness less than the width, the conductive vias having a circular contact surface and the flat portion of the conductive lines in the first and third groups of layers in contact with the circular contact surface of the conductive vias.

7. The method of claim 1 wherein the conductive lines in the first and third groups of layers are planar wiring lines and the conductive vias having a circular contact surface wherein the planar wiring lines directly contact the circular contact surface of the conductive vias.

8. The method of claim 1 wherein the conductive lines in the first and third groups of layers each comprise at least two parallel wiring lines of unequal length in juxtaposition.

9. A method of forming a dielectric substrate having a multiturn inductor, the method comprising the steps of:
   a) obtaining a plurality of layers;
   b) forming conductive lines on a first group of layers;
   c) forming conductive vias in a second group of layers;
   d) forming conductive lines on a third group of layers;
   e) stacking at least one layer from the second group of layers on at least one layer from the third group of layers; and
   f) stacking at least one layer from the first group of layers on the at least one layer from the second group of layers wherein the stacking of the first, second and third groups of layers cause the vias in the second group of layers to contact the conductive lines in the first and third groups of layers to form an inductor buried within a dielectric substrate, wherein the multiturn inductor is in the form of a toroidal shape.

10. A method of forming a dielectric substrate having a multiturn inductor, the method comprising the steps of:
    a) obtaining a plurality of layers;
    b) forming conductive lines on a first group of layers;
    c) forming conductive vias in a second group of layers;
    d) forming conductive lines on a third group of layers;
    e) stacking a first layer from the third group of layers;
    f) stacking at least one layer from the second group of layers on the one layer from the third group of layers;
    g) stacking a second layer from the third group of layers;
    h) stacking at least one layer from the second group of layers on the second layer from the third group of layers;
    i) stacking a first layer from the first group of layers on the at least one layer from the second group of layers in h);
    j) stacking at least one layer from the second group of layers on the first layer from the first group of layers;
    (k) stacking a second layer from the first group of layers on the at least one layer from the second group of layers; and
    (l) wherein the stacking of the first, second and third groups of layers cause the vias in the second groups of layers to contact the conductive lines in the first and third groups of layers to form an inductor buried within a dielectric substrate with each turn of the inductor comprising one conductive line from each layer of the first and third groups of layers and the conductive vias from the second group of layers and wherein, with respect to each turn of the inductor, the one conductive lines from each layer of the first group of layers are parallel and in juxtaposition to form a top of the each turn of the inductor and the one conductive lines from each layer of the third group of layers are parallel and in juxtaposition to form a bottom of the each turn of the inductor.

* * * * *